(12) United States Patent
Kellener et al.

(10) Patent No.: US 8,823,147 B2
(45) Date of Patent: Sep. 2, 2014

(54) SEMICONDUCTOR SUBSTRATE INCLUDING DOPED ZONES FORMING P-N JUNCTIONS

(75) Inventors: Olivier Philippe Kellener, Corbeil Essonnes (FR); Gérard Dubois, Combs la Ville (FR); Mehdi Mohamed Kanoun, Janville sur Juine (FR); Stephen McArdle, Charlestown (GB)

(73) Assignee: Altis Semiconductor, Corbeil Essonnes (FR)

( * ) Notice: Subject to any disclaimer, the term of this patent is extended or adjusted under 35 U.S.C. 154(b) by 0 days.

(21) Appl. No.: 13/555,395

(22) Filed: Jul. 23, 2012

(65) Prior Publication Data

US 2013/0026611 A1   Jan. 31, 2013

(30) Foreign Application Priority Data

Jul. 25, 2011   (FR) ...................... 11 56772

(51) Int. Cl.
*H01L 21/02* (2006.01)
*H01L 21/761* (2006.01)
*H01L 21/8238* (2006.01)
*H01L 21/8249* (2006.01)

(52) U.S. Cl.
CPC .......... *H01L 21/761* (2013.01); *H01L 21/8238* (2013.01); *H01L 21/823878* (2013.01); *H01L 21/8249* (2013.01)
USPC ........................................... 257/655; 438/81

(58) Field of Classification Search
CPC .................................. H01L 21/8238
USPC ............................................................ 257/655
See application file for complete search history.

(56) References Cited

U.S. PATENT DOCUMENTS

| 4,902,633 | A | * | 2/1990 | Cambou ........................ 438/357 |
| 5,237,193 | A | | 8/1993 | Williams et al. |
| 6,191,466 | B1 | | 2/2001 | Yamashita et al. |
| 6,307,232 | B1 | | 10/2001 | Akiyama et al. |
| 2008/0224214 | A1 | | 9/2008 | Lu |

FOREIGN PATENT DOCUMENTS

| DE | 102006031538 | 1/2008 |
| JP | 2001345377 | 12/2001 |
| WO | 9632798 | 10/1996 |

OTHER PUBLICATIONS

International Search Report dated Mar. 5, 2012.

* cited by examiner

*Primary Examiner* — Ajay K Arora
(74) *Attorney, Agent, or Firm* — Sofer & Haroun, LLP

(57) ABSTRACT

A semiconductor substrate (100) has three doped zones (1), (2) and (3), forming a P-N junction (101), the third zone being located between the first zone and the second zone. The P-N junction of the substrate further has a fourth doped zone (4) having a first portion (4A) in contact with the first zone; and a second portion (4B) in contact with the third zone (3), said second portion (4B) extending in the direction of the second zone (2), and not being in contact with the second zone (2); where the fourth zone (4) being doped with the same type of doping as that of the first zone.

14 Claims, 3 Drawing Sheets

US 8,823,147 B2

SEMICONDUCTOR SUBSTRATE INCLUDING DOPED ZONES FORMING P-N JUNCTIONS

RELATED APPLICATION

This application claims the benefit of priority from French Patent Application No. 11 56772, filed on Jul. 25, 2011, the entirety of which is incorporated by reference.

BACKGROUND

1. Field of the Invention

The present invention relates to a semiconductor substrate including doped zones forming respective P-N junctions.

The invention is typically but not exclusively applicable to the field of semiconductor substrates including an embedded or buried layer, generally known as a "buried layer".

More particularly, the semiconductor substrate forms part of an integrated circuit obtained, for example, by means of technologies that are well known to the skilled person such as CMOS (complementary metal oxide semiconductor), BIC-MOS (bipolar-CMOS) or BCD (bipolar, CMOS, CMOS).

2. Description of Related Art

In those various types of technologies, embedded doped layers or "buried layers" are often provided within a semiconductor material in order to assume various functions such as a collector for a bipolar transistor, a drain for a vertical transistor, or simply for vertical isolation at depth. Thus, such layers have multiple applications and may, for example, be used to define a triple well, which corresponds to an isolated zone that is capable of receiving a particular polarization. Document U.S. Pat. No. 7,008,836 may be mentioned in this regard; it describes the fabrication of a P-doped triple well, which is a zone defined by two N-wells within a P-doped silicon semiconductor substrate, those two N-wells being connected together at depth by a "buried" N-doped layer. The front face of the substrate is the face on which the active components of the integrated circuit, such as transistors, for example, are positioned.

One of the two N-wells may readily be used in part to form a P-N junction, in contact with the front face of the substrate, with an adjacent P element (for example another P-well). The diode-type nature of that junction is frequently used to isolate the N- and P-wells from each other by polarizing it with a reverse electric field. The relative distance between the N-well and the P-well determines the applicable maximum electric field for proper isolation of those two elements.

OBJECTS AND SUMMARY

The aim of the present invention is to overcome the disadvantages of the prior art techniques, in particular by proposing a semiconductor substrate comprising a P-N junction in order to allow electrical insulation at a higher voltage, and to significantly limit or even prevent electrical breakdown of said P-N junction from damaging the active components located close to that P-N junction.

The present invention provides a semiconductor substrate comprising doped zones forming a P-N junction, the doped zones comprising:
a first zone doped with a first type of doping;
a second zone doped with a second type of doping; and
a third zone doped with the second type of doping, the third zone being located between the first zone and the second zone, the concentration of doping element of the third zone being lower than the concentration of doping element of the first zone and dower than the concentration of doping element of the second zone;
the substrate being characterized in that the P-N junction further comprises a fourth doped zone comprising:
a first portion (directly) in contact with the first zone; and
a second portion (directly) in contact with the third zone, said second portion extending in the direction of the second zone, and not being (directly) in contact with the second zone;
said fourth zone being doped with the same type of doping as that of the first zone.

In the present invention, the term "directly" in the preferred expression "directly in contact" more particularly signifies "in direct physical contact".

The material used for fabrication of the semiconductor substrate in the context of the present invention is preferably silicon. As a consequence, the various doped zones constituting the substrate are formed from doped silicon material.

The fourth zone enables an electrical breakdown to be situated away from the P-N junction (or buried), which has the advantage of preventing damage to the active components positioned on the top face of the substrate, when that P-N junction is close to said face.

Furthermore, by optimizing the dimensions of the fourth zone, in particular the portion of the fourth zone that is in contact with the third zone, the P-N junction of the invention could accommodate higher voltages, than those of the prior art, while guaranteeing dimensions that are the same as those of the prior art, or even dimensions that are smaller than those of the prior art.

The dimensions of the fourth zone can easily be optimized by using modeling techniques that are familiar to the skilled person, such as solving Poisson's equation by TCAD (technology computer-aided design).

The concentration of doping element may be constant in one or more doped zones and/or may be a concentration gradient in one or more doped zones.

In one particular embodiment, the concentration of doping element of the fourth zone is (strictly) greater than the highest concentration of doping element of the first zone.

In another particular embodiment, the concentration of doping elements of the third zone is (strictly) lower than the lowest concentration of doping element of the first zone, is (strictly) lower than the lowest concentration of doping element of the second zone, and is (strictly) lower than the lowest concentration of doping element of the fourth zone.

By way of example, assuming that the material used for the fabrication of the semiconductor substrate is silicon:
the first zone may be doped with a concentration of active doping elements that may be from $1\times10^{16}$ to $1\times10^{19}$ atoms/cm$^3$;
the second zone may be doped with a concentration of doping element that may be from $1\times10^{16}$ to $1\times10^{19}$ atoms/cm$^3$;
the third zone may be doped with a concentration of active doping elements that may be from $1\times10^{14}$ to $1\times10^{16}$ atoms/cm$^3$; and
the fourth zone may be doped with a concentration of active doping elements that may be from $1\times10^{19}$ to $1\times10^{21}$ atoms/cm$^3$.

The first zone, the second zone, and the fourth zone of the semiconductor substrate of the invention are preferably zones of elongate shape.

More particularly, the longitudinal axis of the first zone is substantially parallel to the longitudinal axis of the second zone, and the longitudinal axis of the fourth zone is substantially perpendicular to the longitudinal axis of the first or the second zone.

The dimension along the longitudinal axis of the fourth elongate zone (i.e. the length of the fourth zone) may be optimized so that the P-N junction defined by the first, second, and third zones can accommodate relatively high voltages, while guaranteeing a compact shape for the third zone. More particularly, the dimension to be optimized is the portion of the fourth zone that extends along its longitudinal axis from the first zone towards the second zone, that portion also being that which is in contact with the third zone.

The semiconductor substrate may comprise a bottom face (or back face) and a top face (or front face), the top face more particularly being a substantially planar face. Preferably, the bottom face is also a substantially planar face, such that the bottom face is parallel to the top face. In particular, the top face is the face on which the active components such as transistors, for example, are positioned.

When the fourth zone is elongate in shape, the zone is said to be "buried", with a longitudinal axis substantially parallel to the top face of the substrate.

The term "buried zone" means a zone disposed in the thickness of the substrate such that it is not in direct physical contact with the bottom face or the top face of the substrate. The zone may be said to be embedded in the substrate.

The P-N junction may be positioned such that the first zone and the second zone are (directly) in contact with the top face of the substrate. For this reason, the first zone electrically connects the fourth zone to the top face of the substrate.

The semiconductor substrate of the invention may further comprise:
  a fifth doped zone, distant from the first zone, said fifth zone being positioned such that the first zone is situated between the second zone and the fifth zone; and
  the first portion of the fourth zone extends in the direction of the fifth zone and up to the fifth zone so as to bring the fourth zone into contact with the fifth zone; the first zone, the fourth zone, and the fifth zone define a sixth doped zone.

In order to form said well, and to define the sixth zone, the fifth zone is preferably distinct from the first zone.

The fifth zone may be doped with the same type of doping as that of the fourth doped zone.

The sixth zone may be doped with the same type of doping as that of the third doped zone.

More particularly, the first zone, the fourth zone and the fifth zone may have a higher concentration of doping element than that of the sixth zone.

By way of example, assuming that the material used for fabrication of the semiconductor substrate is silicon:
  the fifth one may be doped with a concentration of doping element that may be from $1 \times 10^{16}$ to $1 \times 10^{19}$ atoms/cm$^3$;
  the sixth zone may be doped with a concentration of doping element that may be from $1 \times 10^{14}$ to $1 \times 10^{21}$ atoms/cm$^3$.

Existing types of doping are well known to the skilled person. The first type of doping may be N-type doping and the second type may be P-type doping, or vice versa.

The first zone and the second zone may be elongate zones with a longitudinal axis substantially perpendicular to the top face of the substrate.

The fifth zone may also be an elongate zone with a longitudinal axis substantially perpendicular to the top face of the substrate.

More particularly, when the first zone, the fourth zone, and the fifth zone are zones that are elongate along their respective longitudinal axis, these three elongate zones form a letter "F" in which the vertical bar of the "F" corresponds so the fourth zone, the upper horizontal bar of the "F" corresponds to the fifth zone, and the lower horizontal bar of the "F" corresponds to the first zone.

The semiconductor substrate of the invention may also comprise an electrically insulating element (directly) in contact with the top face of the substrate and located between the first zone and the second zone. This electrically isolating element is preferably (directly) in contact with a portion of the first zone and a portion of the second zone.

The electrically isolating element may be a shallow trench isolation (STI) element. This surface isolation acts to electrically isolate the P-N junction from the active components positioned on the top surface of the substrate, such as transistors etc., for example.

Existing types of doping are well known to the skilled person. The first type of doping may be N-type doping and the second may be P-type doping, or vice versa.

Assuming that the material used for fabrication of the semiconductor is silicon, the N-type doping elements are generally selected from atoms having five valence electrons such as those from column 15 (VA) of the periodic classification of the elements. Examples that may be mentioned are phosphorus (P), arsenic (As) and antimony (Sb).

The P-type doping elements are generally selected from trivalent atoms, such as those from column 13 (IIIA) of the periodic classification of the elements. Examples that may be mentioned are boron (B), indium (In), etc.

In a particularly preferred embodiment, the fourth zone has N-type doping. For this reason, the first zone, with which the fourth zone is in direct contact, is given N-type doping. The second zone, with which the fourth zone is not directly in contact, has P-type doping. Finally, the third zone is also given P-type doping.

BRIEF DESCRIPTION OF THE DRAWINGS

Further characteristics and advantages of the present invention become apparent from the following description of non-limiting examples of a semiconductor substrate of the invention and of electrical simulations made with reference to FIGS. 1 to 5.

DETAILED DESCRIPTION

For the purposes of clarity, only elements essential to understanding the invention have been shown in a diagrammatic manner, and not to scale.

Figure 1:
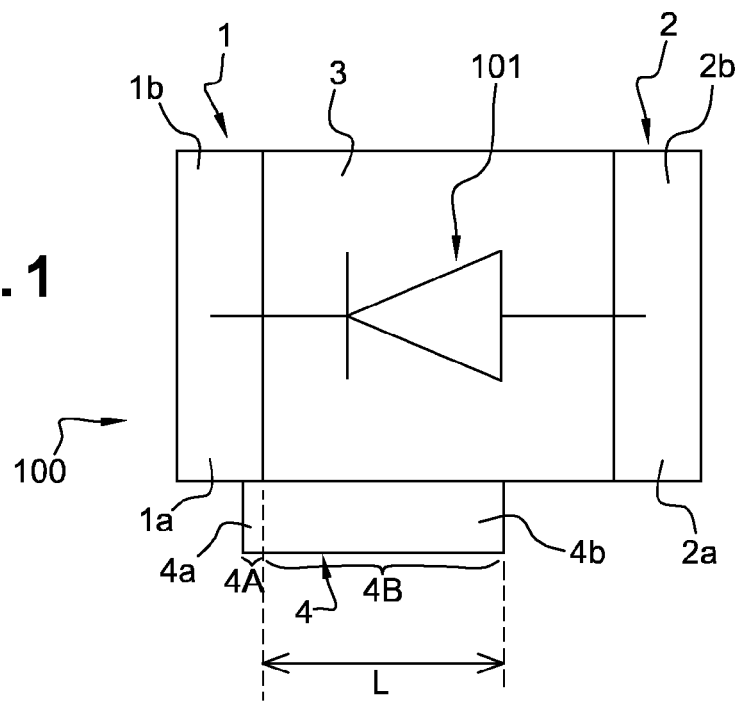
FIG. 1 represents a partial vertical sectional view of a first embodiment of a semiconductor substrate comprising a P-N junction.
Figure 2:
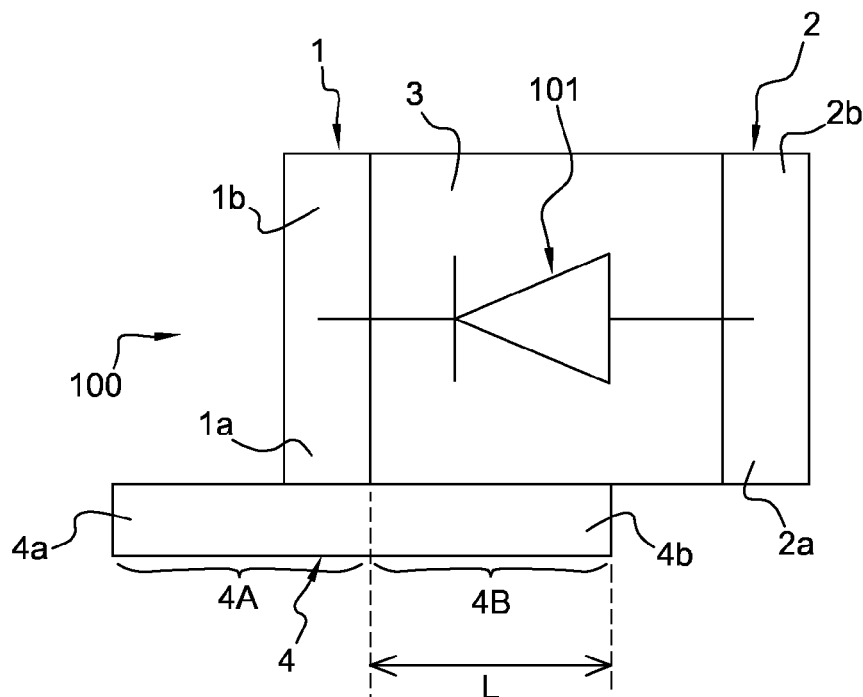
FIG. 2 represents a vertical sectional view of a second embodiment of FIG. 1.
Figure 3:
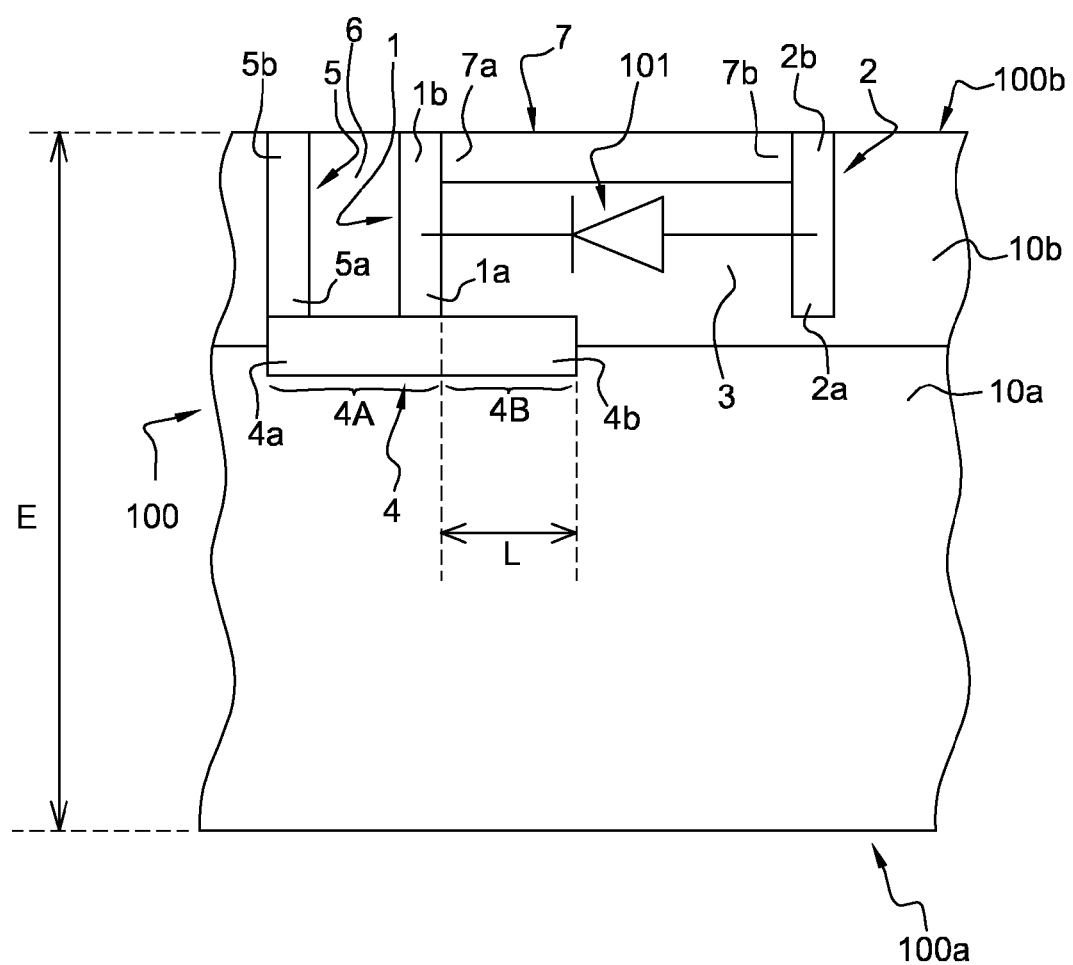
FIG. 3 represents a vertical sectional view of a semiconductor substrate comprising a P-N junction such as that shown in FIG. 2, this P-N junction being partially integrated into a triple well configuration.

The terms "bottom", "top", "vertical" and "horizontal" do not in any way limit the present invention and are used merely to facilitate comprehension of the invention having regard to the positioning of the substrate as shown in FIGS. 1, 2 and 3 of the invention.

The semiconductor substrate 100 of FIG. 1, of the silicon type, comprises a P-N junction 101 formed by:
- a first zone 1 of silicon with N-type doping, the concentration of doping element being from $1\times10^{16}$ to $1\times10^{19}$ atoms/cm$^3$, for example;
- a second zone 2 of silicon with P-type doping, the concentration of doping element being from $1\times10^{16}$ to $1\times10^{19}$ atoms/cm$^3$, for example; and
- a third zone 3 of silicon with P-type doping, the concentration of doping element being from $1\times10^{13}$ to $1\times10^{16}$ atoms/cm$^3$, for example.

The third zone 3 is interposed between the first zone 1 and the second zone 2. The concentration of doping element of the third zone is lower than the concentration of doping element of the first zone 1 and of the second zone 2.

The first zone 1 and the second zone 2 are zones with an elongate shape, of the substantially rectangular type, which are substantially parallel. In FIG. 1, their longitudinal axis is positioned vertically.

The longitudinal axis of the first elongate zone terminates in two ends 1a, 1b.

The longitudinal axis of the second elongate zone terminates in two ends 2a, 2b.

At one of the ends 1a of the first zone 1 is a fourth zone 4 of silicon with N-type doping. This fourth zone 4 has a concentration of doping element that is higher than the highest concentration of doping element of the first zone. By way of example, the concentration of doping element of the fourth zone may be from $1\times10^{19}$ to $1\times10^{21}$ atoms/cm$^3$.

The fourth zone is elongate in shape, substantially rectangular in type and is substantially perpendicular to the first and second elongate zones. It comprises a first portion 4A in contact with the first zone 1, and a second portion 4B in contact with the third zone 3, extending in the direction of the second zone 2 without touching it. Furthermore, the longitudinal axis of said fourth zone 4 terminates in two ends 4a, 4b.

More particularly, in the embodiment shown in FIG. 1, one of its ends 4a is directly in contact with the first zone 1 or, more particularly, with one of the ends 1a of the first zone. Furthermore, the fourth zone 4 is also directly in contact with the third zone 3 and its end 4b extends towards the second zone without being in contact therewith.

In the embodiment shown in FIG. 2, the end 4a of the fourth zone extends in the direction opposite to the end 4b. Thus, the end 1a of the first zone, which is directly in contact with the fourth zone, is located at a distance from the two ends 4a, 4b of the fourth zone.

In FIG. 1 or 2, the length L of the portion of the fourth zone (second portion 4B) extending from the first zone 1 towards the second zone 2 may be optimized such that the P-N junction can accommodate relatively high voltages while guaranteeing miniaturization of the structure.

Optimization of said length L may be easily carried out by techniques that are well known to the skilled person, in particular by modeling and digital solving (TCAD). Several commercial software programs are available to facilitate this optimization.

FIG. 3 represents a particular embodiment of a semiconductor substrate comprising a P-N junction as defined in FIG. 2, this P-N junction being partially integrated into a triple well configuration.

The silicon substrate 100 is produced by forming, by means of epitaxial growth on a first layer 10a of P-doped silicon, a second layer 10b of P-doped silicon. In this example, the thickness of the layer 10a may be in the range 500 μm [micrometer] to 800 μm, and the thickness 10b may be in the range 1 μm to 10 μm. The substrate thus comprises a bottom face 100a (or back face) formed by said first layer 10a and a top face 100b (or front face) formed by said second layer 10b. In FIG. 3, the bottom face 100a and the top face 100b of the substrate are both substantially planar, horizontal faces.

The top face of the substrate is intended to comprise the active components such as transistors, etc.

The thickness E of the substrate 100 is thus defined in FIG. 3 as being the overall thickness of the first and the second layers of silicon.

The substrate also comprises the P-N junction as described in FIG. 2.

The fourth elongate zone 4 of the P-N junction is a "buried" layer embedded in the substrate 100, which can diffuse in part into the first and into the second layer of silicon 10a, 10b.

The first and second elongate zones extend into the thickness E of the substrate and have their longitudinal axis substantially perpendicular to the top face 100b of the substrate.

The longitudinal axis of the fourth zone is substantially parallel to the top face 100b of the substrate.

The first zone 1 and the second zone 2 are in contact with the top face of the substrate. More particularly, the end 1b of the first zone is directly in contact with the top face of the substrate, and the end 2b of the second zone is directly in contact with the top face of the substrate.

For this reason, the first zone 1 connects the fourth zone 4 to the top face of the substrate.

The semiconductor substrate 100 further comprises a fifth doped zone 5 at a distance from the first zone, said fifth zone being positioned such that the first one 1 is located between the second zone 2 and said fifth zone 5. This fifth zone 5 is doped with the same doping as that of the fourth doped zone 4, i.e. N-type doping.

This fifth zone 5 is a zone with an elongate shape with a substantially rectangular type, with a longitudinal axis that terminates in two ends 5a, 5b. It is substantially perpendicular to the to face 100b of the substrate.

The fifth zone 5 is in contact with the top face of the substrate. More particularly, the end 5b of the fifth zone is directly in contact with the top face of the substrate.

Further, the fourth zone with an elongate shape extends to the fifth zone so as to bring the end 4a of the fourth zone into contact with the end 5a of the fifth zone.

Thus, the first zone 1 and the fifth zone 5 connect the fourth zone 4 to the top face of the substrate.

For this reason, the first zone (i.e. N-well), the fourth zone (i.e. N-doped buried layer) and the fifth zone (i.e. N-well) define an isolated P-type well (i.e. a P-doped triple well) corresponding to a sixth doped zone 6, said sixth zone having the same doping type as that of the third doped zone 3, namely P-type doping.

An N-type isolated well (i.e. an N-doped triple well) could also clearly be considered when the first zone, the fourth zone, and the fifth zone are zones with P-type doping.

Referring now to FIG. 3, the first zone 1, the fourth zone 4 (i.e. the buried layer) and the fifth zone 5 form the letter "F" in which the vertical bar of the "F" corresponds to the fourth zone, the upper horizontal bar of the "F" corresponds to the fifth zone and the lower horizontal, bar of the "F" corresponds to the first zone.

The concentrations of doping elements in the fifth and sixth zones may be as follows:
- for the fifth zone, the concentration of doping element may be of the same order as that of the first zone; and
- for the sixth zone, the concentration of doping element may be $1\times10^{14}$ to $1\times10^{21}$ atoms/cm$^3$.

The semiconductor substrate of the invention may also comprise an electrically isolating element 7 in contact with the top face 100b of the substrate and located between the first zone 1 and the second zone 2.

In FIG. 3, this electrically isolating element is a surface isolation element, known as a shallow trench isolation (STI) element.

Silicon oxide ($SiO_2$) may be mentioned as an electrically isolating constituent material of said surface isolation 7.

In FIG. 3, this surface isolation 7 is represented by an elongate element with a longitudinal axis substantially parallel to that of the substrate that terminates in two ends 7a, 7b.

The end 7a and the end 7b of the surface isolation 7 are respectively in contact with the end 1b of the first zone and with the end 2b of the second zone.

Thus, the unit formed by the first zone, the surface isolation (STI), and the second zone forms an upside-down "U" with its horizontal bar corresponding to the surface isolation 7 and with its two vertical bars corresponding to the first and second zones 1 and 2.

The portion of the fourth zone 4 in contact with the third zone partly faces the surface isolation and is separated from the surface isolation by the third zone 3.

Clearly, the P-type doping mentioned in the descriptions of FIGS. 1, 2, and 3 may be N-type doping, and the N-type doping mentioned in the description of said figures may be P-type doping.

The semiconductor substrate comprising the P-N junction of the invention may be produced using techniques that are well known to the skilled person.

By way of example, the semiconductor substrate represented in FIG. 3 may be fabricated as follows.

The fourth zone 4 is initially formed by applying a resin mask defining said fourth zone in the first layer 10a of P-doped silicon.

The N-type doping element of the fourth zone is then surface implanted in the fourth zone; the resin is then eliminated.

In order to activate the N-type doping element of the fourth zone, the substrate is heated to a temperature of more than 1000° C.

Next, epitaxial growth is carried out using boron in a concentration of $1 \times 10^{15}$ atoms/$cm^3$ at the substrate surface over the fourth zone 4 and the first layer 10a.

Once epitaxial growth has ended in order to form the second layer 10b, the N-type wells are formed by applying a mask to define the first zone 1 and the fifth zone 5. Next, the N-type doping element is surface implanted and implanted at depth in the wells 1 and 5. Finally, the resin is eliminated.

A P-type well is also formed by applying a mask to define the second zone 2. Next, the P-type doping element is surface implanted and implanted at depth in the well 2. Finally, the resin is eliminated.

In order to activate the N-type doping element of the first zone and the P-type doping element of the second zone, the substrate is heated to a temperature of more than 1000° C.

The degree of doping of the third zone 3 is determined by the nature of the epitaxial growth and the second layer 10b.

In order to demonstrate the advantages of the semiconductor substrate of the invention, simulation tests were carried out.

These tests allowed the electrical behavior between a conventional P-N junction (FIG. 4) and a P-N junction of the invention (FIG. 5) to be compared.

Figure 5:
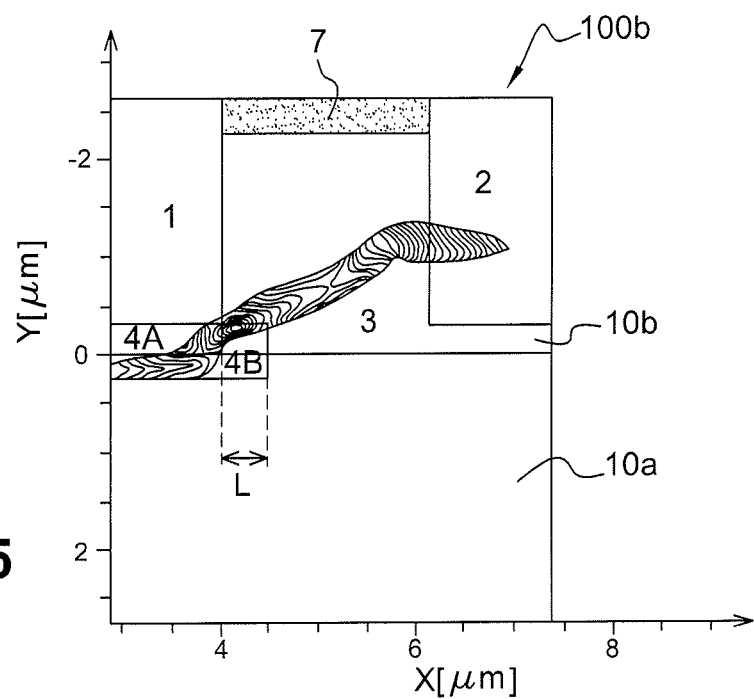
FIG. 5 represents an electrical simulation of the breakdown current density lines of a P-N junction of the invention.

The P-N junction of FIG. 5 corresponds to those shown in FIG. 1, 2 or 3, namely:

- the first zone 1 corresponds to a N-doped well ($1 \times 10^{16}$ to $1 \times 10^{19}$ atoms/$cm^3$);
- the second zone 2 corresponds to a P-doped well ($1 \times 10^{16}$ to $1 \times 10^{19}$ atoms/$cm^3$);
- the third zone 3 (or the second layer 10b) corresponds to a lightly P-doped zone (epitaxial doping, $1 \times 10^{15}$ atoms/$cm^3$);
- the fourth zone 4 corresponds to a N-doped buried one (buried layer) ($1 \times 10^{19}$ to $1 \times 10^{21}$ atoms/$cm^3$).

The first layer 10a corresponds to a slightly P-doped zone ($1 \times 10^{15}$ atoms/$cm^3$).

The spacing between the first zone 1 and the second zone 2, defined by the third zone, is 2 μm. The fourth zone is buried at a distance of 2.5 μm from the top face of the substrate 100b.

The extension 4B of the buried fourth zone extends over a length L of 0.5 μm from the first zone 1 in the direction of the second zone 2, and is in contact with the third zone 3 without being in contact with the second zone 2.

Figure 4:
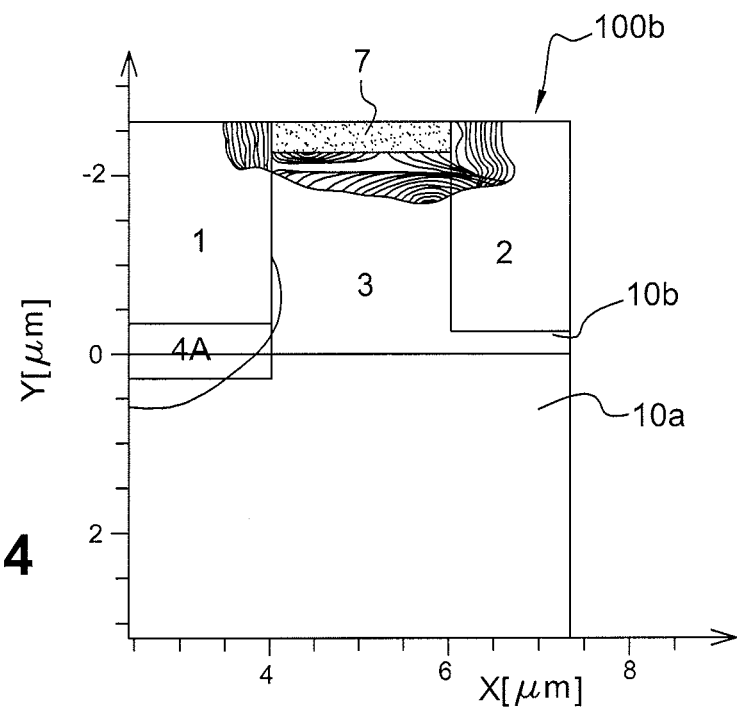
FIG. 4 represents an electrical simulation of the breakdown current density lines of a prior art P-N junction.

The P-N junction of FIG. 4 is identical to that described in FIG. 5 with the exception that it does not comprise the extension 4B of the fourth buried zone.

The current density line simulations are shown on FIGS. 4 and 5 and were produced using Sentaurus (Synopsis) v2009.06 software by application of the VanOverStraten electrical model.

Briefly, the electrical modeling carried out by this software consists in simulating a progressive rise in the voltage at the terminals of the P-N junction and of determining the value and distribution of the resulting current.

At the start of this iterative process, and thus for low to moderate voltages, the polarization of the P-N junction is reversed and remains in a diode type isolation mode. When the simulated voltage increases and approaches the breakdown voltage, a large avalanche current is created.

In these simulations, the value for the breakdown voltage has been arbitrarily defined as the voltage beyond which the current produced becomes more than a total threshold current of 1 microamp.

FIGS. 4 and 5 show the topographical view of the current densities obtained from the software at the moment of breakdown (iso-contour curves in amps/$cm^2$) and thus can be used to evaluate the location of the avalanche current that is produced.

It can easily be seen that the current generated at the moment of breakdown is close to the top face 100b of the semiconductor substrate on FIG. 4, while in FIG. 5 it is far from the top face 100b of said substrate, or in other words it is buried in the substrate.

Further, the P-N junction represented in FIG. 4 is properly isolated (i.e. no breakdown) from 0 V [volt] until a voltage of 34.8 V is applied. The P-N junction represented in FIG. 5 is properly isolated (i.e. without breakdown) from 0 V until a voltage of 38 V is applied.

As a consequence, the present invention improves the electrical isolation behavior of the P-N junction by 9% due to the presence of the portion 4B of the fourth zone.

The invention claimed is:

1. A semiconductor substrate having doped zones forming a P-N junction, the doped zones comprising:
   a first zone doped with a first type of doping;
   a second zone doped with a second type of doping; and
   a third zone doped with the second type of doping, the third zone being located between the first zone and the second zone, the concentration of doping element of the third zone being lower than the concentration of doping element of the first zone and lower than the concentration of doping element of the second zone;

wherein the P-N junction of the substrate further comprising a fourth doped zone having:
a first portion in contact with the first zone; and
a second portion in contact with the third zone, said second portion extending in the direction of the second zone, and not being in contact with the second zone;
said fourth zone being doped with the same type of doping as that of the first zone, and the concentration of doping element of the fourth zone is greater than the highest concentration of doping element of the first zone.

2. A semiconductor substrate according to claim 1, wherein the concentration of doping element of the third zone is tower than the lowest concentration of doping element of the first zone, of the second zone, and of the fourth zone.

3. A semiconductor substrate according to claim 1, wherein the first zone, the second zone and the fourth zone are zones with an elongate shape each having a central longitudinal axis, wherein the longitudinal axis of the first zone is substantially parallel to the longitudinal axis of the second zone, and the longitudinal axis of the fourth zone being substantially perpendicular to the longitudinal axis of the first or the second zone.

4. A semiconductor substrate according to claim 1, characterized in that it comprises a bottom face and a top face, the top face being a substantially planar face.

5. A semiconductor substrate according to claim 3, wherein the fourth zone is a buried zone with a longitudinal axis that is substantially parallel to the top face of the substrate.

6. A semiconductor substrate according to claim 4, wherein the first zone and the second zone are in contact with the top face of the substrate.

7. A semiconductor substrate according to claim 1, wherein said semiconductor further comprises:

a fifth doped zone, distant from the first zone, said fifth zone being positioned such that the first zone is situated between the second zone and the fifth zone; and
the first portion of the fourth zone extends in the direction of the fifth zone and up to the fifth zone so as to bring the fourth zone into contact with the fifth zone; the first zone, the fourth zone and the fifth zone define a sixth doped zone.

8. A semiconductor substrate according to claim 7, wherein the fifth zone is in contact with the top face of the substrate.

9. A semiconductor substrate according to claim 7, wherein the fifth zone has the same doping type as that of the fourth doped zone.

10. A semiconductor substrate according to claim 7, wherein the sixth zone has the same type of doping as that of the third doped zone.

11. A semiconductor substrate according to claim 7, wherein the first zone and the second zone are elongate zones with a longitudinal axis substantially perpendicular to the top face of the substrate.

12. A semiconductor substrate according to claim 7, wherein the fifth zone is an elongate zone with a longitudinal axis that is substantially perpendicular to the top face of the substrate.

13. A semiconductor substrate according to claim 7, wherein said semiconductor substrate further comprises an electrically isolating element in contact with the top face of the substrate and located between the first zone and the second zone.

14. A semiconductor substrate according to claim 1, wherein the first type of doping is N (or P) type and the second type of doping is P (or N) type.

* * * * *

UNITED STATES PATENT AND TRADEMARK OFFICE
CERTIFICATE OF CORRECTION

PATENT NO.         : 8,823,147 B2                                    Page 1 of 1
APPLICATION NO.    : 13/555395
DATED              : September 2, 2014
INVENTOR(S)        : Kellener et al.

It is certified that error appears in the above-identified patent and that said Letters Patent is hereby corrected as shown below:

In the Claims

Column 9, Claim 2, Line 12: The word "tower" between the words "is" and "than" should read "lower"

Signed and Sealed this
Thirtieth Day of December, 2014

Michelle K. Lee
*Deputy Director of the United States Patent and Trademark Office*